United States Patent
Mori et al.

(10) Patent No.: US 8,624,640 B2
(45) Date of Patent: Jan. 7, 2014

(54) INDUCTIVE LOAD DRIVING DEVICE

(75) Inventors: Masamitsu Mori, Shioya-gun (JP);
Yasutoshi Aso, Utsunomiya (JP)

(73) Assignee: Keihin Corporation (JP)

( * ) Notice: Subject to any disclaimer, the term of this patent is extended or adjusted under 35 U.S.C. 154(b) by 93 days.

(21) Appl. No.: 13/227,835

(22) Filed: Sep. 8, 2011

(65) Prior Publication Data
US 2012/0074989 A1    Mar. 29, 2012

(30) Foreign Application Priority Data

Sep. 24, 2010  (JP) .................................. 2010-213096

(51) Int. Cl.
*H03B 1/00* (2006.01)
*H03K 3/00* (2006.01)

(52) U.S. Cl.
USPC .............................. 327/110; 327/112; 326/82

(58) Field of Classification Search
USPC ....................... 327/110, 112; 326/82; 307/104
See application file for complete search history.

(56) References Cited

U.S. PATENT DOCUMENTS

| 7,466,170 B2* | 12/2008 | Balakrishnan ................ 327/112 |
| 7,535,268 B2* | 5/2009 | Horai et al. .................... 327/110 |
| 2005/0168249 A1* | 8/2005 | Dequina et al. ................ 327/110 |

FOREIGN PATENT DOCUMENTS

| JP | 2005-333768 A | 12/2005 |
| JP | 2008-85046 A | 4/2008 |

* cited by examiner

*Primary Examiner* — John Poos
(74) *Attorney, Agent, or Firm* — Cantor Colburn LLP

(57) ABSTRACT

An inductive load driving device includes a first switching element, a second switching element, a counter current regeneration circuit, and a circuit element protection circuit. The first switching element is coupled between an output terminal of the power circuit and one end of the inductive load. The second switching element is coupled between the other end of the inductive load and a ground terminal. The counter current regeneration circuit is configured to supply to the output terminal of the power circuit, a counter current output from the other end of the inductive load when the first and second switching elements are in off-state. The circuit element protection circuit is configured to turn on the second switching element when a value of the output voltage of the power circuit becomes equal to or more than a threshold value.

4 Claims, 2 Drawing Sheets

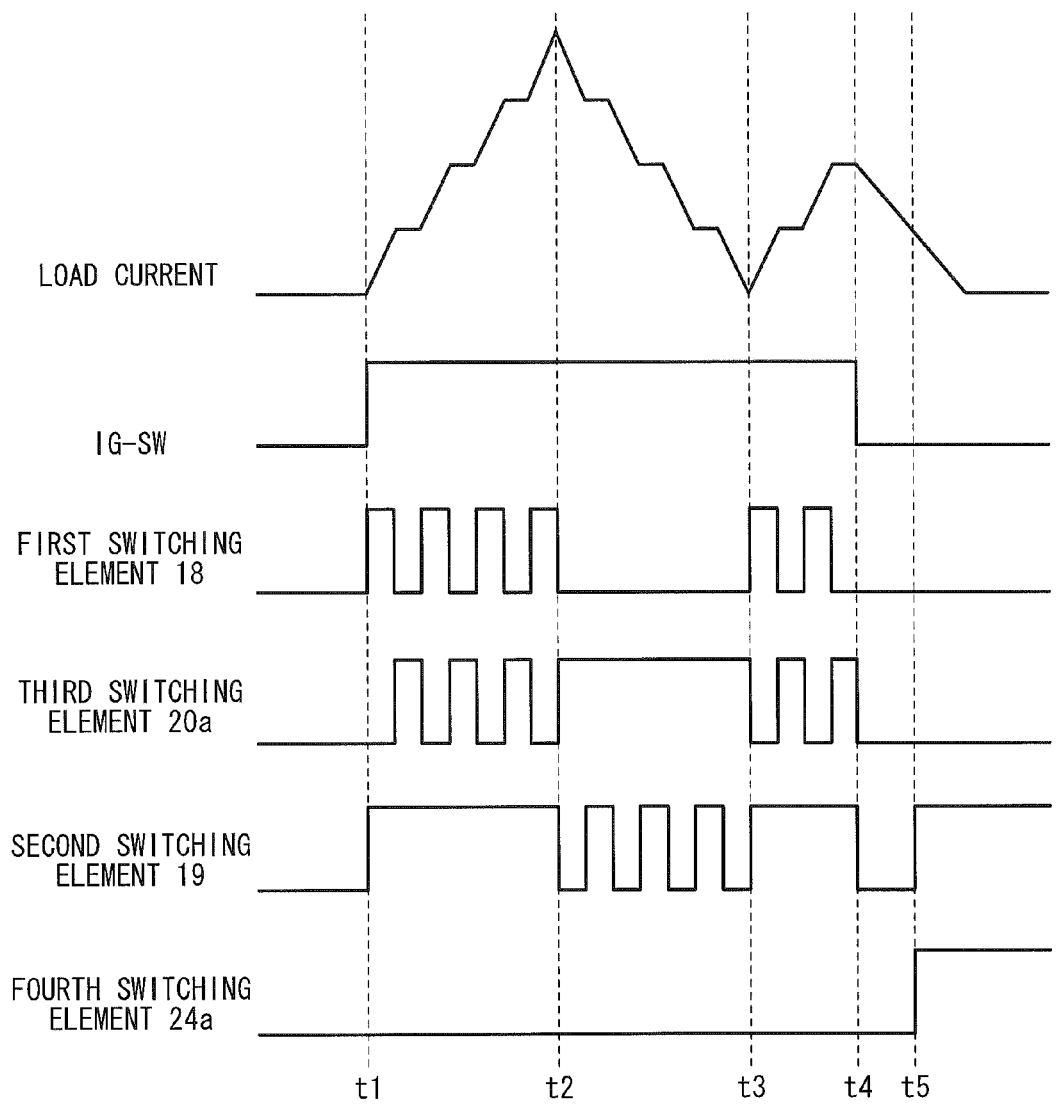

INDUCTIVE LOAD DRIVING DEVICE

BACKGROUND OF THE INVENTION

1. Field of the Invention

The present invention relates to an inductive load driving device.

Priority is claimed on Japanese Patent Application No. 2010-213096, filed Sep. 24, 2010, the content of which is incorporated herein by reference.

2. Description of the Related Art

Japanese Patent Laid-Open Publication No. 2008-85046 discloses an inductive load driving device including: a first switching element coupled between one end of an inductive load and an external power supply; a second switching element coupled between the other end of the inductive load and a ground terminal; a looping circuit configured to supply to the ground terminal, a counter current output from the inductive load when the first switching element is in off-state and the second switching element is in on-state; a counter current regeneration circuit configured to supply to the external power supply, a counter current output from the inductive load when the first and second switching elements are in off-state.

The inductive load driving device having the above configuration controls a ratio between durations of the on-state and the off-state of the first switching element (i.e., duty cycle), and thereby can control the rise characteristics. Additionally, the inductive load driving device controls the duty cycle of the second switching element while keeping the first switching element in off-state, and thereby can supply a counter current output from the inductive load to the external power source while controlling the fall characteristics.

Regarding the above inductive load driving device, when a power is supplied from a power circuit, such as a booster circuit, a counter current, which is output from the inductive load when the first and second switching elements are in off-state, flows to the output terminal of the power circuit through the counter current regeneration circuit. Generally, the power circuit includes a capacitor coupled between the output terminal of the power circuit and the ground terminal. When the counter current flows to the output terminal of the power circuit, a voltage, which is obtained by subtracting the amount of voltage drop caused by the counter current regeneration circuit from the counter voltage, is applied to the capacitor. When the applied voltage exceeds the rated voltage, the capacitor might be broken down.

SUMMARY

An inductive load driving device according to an embodiment of the present invention includes a first switching element, a second switching element, a counter current regeneration circuit, and a circuit element protection circuit. The first switching element is coupled between an output terminal of the power circuit and one end of the inductive load. The second switching element is coupled between the other end of the inductive load and a ground terminal. The counter current regeneration circuit is configured to supply to the output terminal of the power circuit, a counter current output from the other end of the inductive load when the first and second switching elements are in off-state. The circuit element protection circuit is configured to turn on the second switching element when a value of the output voltage of the power circuit becomes equal to or more than a threshold value.

BRIEF DESCRIPTION OF THE DRAWINGS

The above features and advantages of the present invention will be more apparent from the following description of certain preferred embodiments taken in conjunction with the accompanying drawings, in which:

FIG. 2 is a timing chart illustrating operations of the inductive load driving device.

DETAILED DESCRIPTION OF THE PREFERRED EMBODIMENTS

Figure 1:
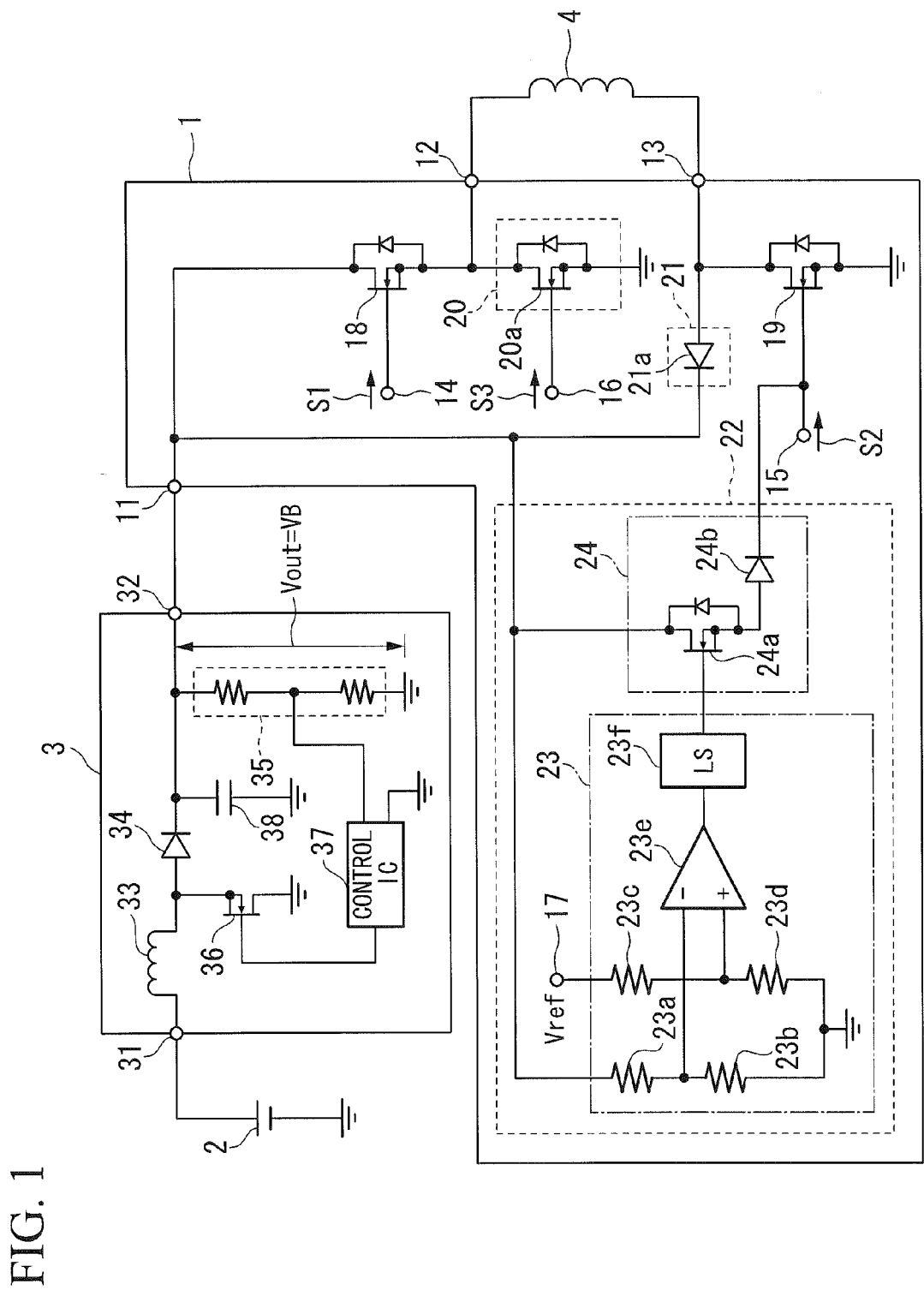
FIG. 1 illustrates a circuit configuration of an inductive load driving device according to a first embodiment of the present invention.

The present invention will now be described herein with reference to illustrative embodiments. The accompanying drawings explain an inductive load driving device in the embodiments. The size, the thickness, and the like of each illustrated portion might be different from those of each portion of an actual inductive load driving device.

Those skilled in the art will recognize that many alternative embodiments can be accomplished using the teachings of the present invention and that the present invention is not limited to the embodiments illustrated herein for explanatory purposes.

Hereinafter, a first embodiment of the present invention is explained. FIG. 1 illustrates a circuit configuration of an inductive load driving device 1 according to the first embodiment. In FIG. 1, reference numeral 2 denotes a DC (direct-current) power supply, such as a battery. Reference numeral 3 denotes a booster circuit (power circuit) configured to boost a voltage of the DC power supply 2 and generate a power voltage VB of the inductive load driving device 1. Reference numeral 4 denotes an inductive load, such as a solenoidal coil and a motor coil.

The booster circuit 3 includes: an input terminal 31 coupled to the DC power supply 2; an output terminal 32 coupled to the inductive load driving device 1; a coil 33, one end of which is coupled to the input terminal 31; a diode 34 having an anode terminal coupled to the other end of the coil 33 and a cathode terminal coupled to the output terminal 32; a voltage dividing circuit 35 coupled between the output terminal 32 and a ground terminal; a switching element 36 coupled between the anode terminal of the diode 34 and a ground terminal; a control IC 37 configured to refer to an output value of the voltage dividing circuit 35 and to PWM-control on/off state of the switching element 36 so as to keep the output voltage Vout=VB; and a booster capacitor 38 coupled between the output terminal 32 and a ground terminal.

The circuit configuration of the booster circuit 3 is known as disclosed in, for example, Japanese Patent Laid-Open Publication No. 2005-333768. However, the circuit configuration of the booster circuit 3 is not limited thereto. It is noted here that the booster circuit 3 includes a booster capacitor 38 coupled between the output terminal 32 and a ground terminal.

The inductive load driving device 1 includes: a power connection terminal 11 coupled to the output terminal 32 of the booster circuit 3; a first load connection terminal 12 coupled to one end of the inductive load 4; a second load connection terminal 13 coupled to the other end of the inductive load 4; a first signal input terminal 14 coupled to a control device (not shown); a second signal input terminal 15; a third signal input terminal 16; a reference voltage input terminal 17 coupled to a reference voltage output circuit (not shown) configured to output a reference voltage Vref; a first switching element 18; a second switching element 19; a looping circuit 20; a counter current regeneration circuit 21; and a circuit element protection circuit 22.

The first switching element 18 is an n-type FET (field-effect transistor) coupled between the power connection terminal 11 (the output terminal 32 of the booster circuit 3) and the first load connection terminal 12 (the one end of the inductive load 4). Specifically, a drain terminal of the first switching element 18 is coupled to the power connection terminal 11. A source terminal of the first switching element 18 is coupled to the first load connection terminal 12. A gate terminal of the first switching element 18 is coupled to the first signal input terminal 14. The first switching element 18 turns on and off according to a PWM signal (signal having been subjected to pulse-width modulation) 51 which the control device inputs to the gate terminal of the first switching element 18 through the first signal input terminal 14.

The second switching element 19 is an n-type FET coupled between the second load connection terminal 13 (the other end of the inductive load 4) and the ground terminal. Specifically, a drain terminal of the second switching element 19 is coupled to the second load connection terminal 13. A source terminal of the second switching element 19 is coupled to the ground terminal. A gate terminal of the second switching element 19 is coupled to the second signal input terminal 15. The second switching element 19 is configured to turn on and off according to a PWM signal S2 which the control device inputs to the gate terminal of the second switching element 19 through the second signal input terminal 15.

The looping circuit 20 is configured to supply back to the one end of the inductive load 4 through the ground terminal, a counter current output from the other end of the inductive load 4 when the first switching element 18 is in off-state and the second switching element 19 is in on-state. The looping circuit 20 is coupled between the one end of the inductive load 4 (first load connection terminal 12) and the ground terminal. The looping circuit 20 includes a third switching element 20a configured to turn on and off inversely to the first switching element 18. Specifically, the third switching element 20a is in on-state while the first switching element 18 is in off-state. On the other hand, the third switching element 20a is in off-state while the first switching element 18 is in on-state.

The third switching element 20a is an n-type FET. A drain terminal of the third switching element 20a is coupled to the first load connection terminal 12. A source terminal of the third switching element 20a is coupled to the ground terminal. A gate terminal of the third switching element 20a is coupled to the third signal input terminal 16. The third switching element 20a is configured to turn on and off according to a PWM signal S3 (signal having a signal level inverse to that of the PWM signal S1) which the control device inputs to the gate terminal of the third switching element 20a through the third signal input terminal 16.

The counter current regeneration circuit 21 is configured to supply to the output terminal 32 of the booster circuit 3, a counter current output from the other end of the inductive load 4 when both the first and second switching elements 18 and 19 are in off-state. The counter current regeneration circuit 21 includes a first diode 21a. An anode terminal of the first diode 21a is coupled to the second load connection terminal 13 (the other end of the inductive load 4). A cathode terminal of the first diode 21a is coupled to the power connection terminal 11 (the output terminal 32 of the booster circuit 3).

The circuit element protection circuit 22 is configured to turn on the second switching element 19 when a value of the output voltage Vout of the booster circuit 3 becomes equal to or more than a threshold value. The circuit element protection circuit 22 includes a determination circuit 23 and a conduction circuit 24.

The determination circuit 23 is configured to determine whether or not a value of the output voltage Vout of the booster voltage 3 becomes equal to or more than the threshold value by comparing a value of a divided voltage of the output voltage Vout of the booster circuit 3 and a value of a divided voltage of the reference voltage Vref. The determination circuit 23 includes; a first resistor element 23a; a second register element 23b; a third register element 23c; a fourth register element 23d; a comparator 23e; and a level shifter 23f.

One end of the first register element 23a is coupled to the power connection terminal 11 (the output terminal 32 of the booster circuit 3). The other end of the first register element 23a is coupled to an inverse input terminal (−) of the comparator 23e. One end of the second register element 23b is coupled to the other end of the first register element 23a. The other end of the second register element 23b is coupled to a ground terminal. In other words, the first and second register elements 23a and 23b form a voltage dividing circuit configured to divide the output voltage Vout of the booster circuit 3.

One end of the third register element 23c is coupled to the reference voltage input terminal 17. The other end of the third register element 23c is coupled to a non-inverse input terminal (+) of the comparator 23e. One end of the fourth register element 23d is coupled to the other end of the third register terminal 23c. The other end of the fourth register element 23d is coupled to a ground terminal. In other words, the third and fourth register elements 23c and 23d form a voltage dividing circuit configured to divide the reference voltage Vref.

The comparator 23e compares a value of a divided voltage of the output voltage Vout of the booster circuit 3, which is input to the inverse input terminal (−), and a value of a divided voltage of the reference voltage Vref, which is input to the non-inverse input terminal (+), and thereby outputs a signal according to a result of the comparison to the level shifter 23f. Specifically, the comparator 23e outputs a low-level signal when the value of the divided voltage of the output voltage Vout becomes equal to or more than the value of the divided voltage of the reference voltage Vref (i.e., when a voltage of the inverse input terminal becomes equal to or more than a voltage of the non-inverse input terminal). Otherwise, the comparator 23e outputs a high-level signal.

Here, values of resistances of the first to fourth register elements 23a, 23b, 23c, and 23d are determined so that a low-level signal is output when a value of the output voltage Vout of the booster circuit 3 becomes equal to or more than a threshold value (for example, when the value of the output voltage Vout becomes within a range of 45 to 49 V with respect to the rated voltage 50 V).

Upon receiving a high-level signal from the comparator 23e, the level shifter 23f outputs a low-level signal to the conduction circuit 24. Upon receiving a low-level signal from the comparator 23e, the level shifter 23f outputs a high-level signal to the conduction circuit 24. In other words, when a value of the output voltage Vout becomes equal to or more than the threshold value, the level shifter 23f outputs the high-level signal to the conduction circuit 24. Otherwise, the level shifter 23f outputs the low-level signal to the conduction circuit 24.

When the determination circuit 23 determines that a value of the output voltage Vout of the booster circuit 3 becomes equal to or more than the threshold value, the conduction circuit 24 electrically couples the output terminal 32 of the booster circuit 3 to the gate terminal (control terminal) of the second switching element 19. The conduction circuit 24 includes a fourth switching element 24a and a second diode 24b.

The fourth switching element 24a is an n-type FET coupled between the power connection terminal 11 (the output terminal 32 of the booster circuit 3) and an anode terminal of the second diode 24b. Specifically, a drain terminal of the fourth switching element 24a is coupled to the power connection terminal 11. A source terminal of the fourth switching element 24a is coupled to the anode terminal of the second diode 24b. A gate terminal of the fourth switching element 24a is coupled to the output terminal of the level shifter 23f. A cathode terminal of the second diode 24b is coupled to the gate terminal of the second switching element 19.

When the level shifter 23f inputs a high-level signal to the conduction circuit 24 having the above configuration, the fourth switching element 24a turns on, and the output terminal 32 of the booster circuit 3 is electrically coupled to the gate terminal of the second switching element 19. In other words, when a value of the output voltage Vout of the booster circuit 3 becomes equal to or more than the threshold value, the output voltage Vout of the booster circuit 3 (actually, a voltage obtaining by subtracting from the output voltage Vout, the amount of voltage drop caused by the fourth switching element 24a and the second diode 24b) is applied to the gate terminal of the second switching element 19, and thereby the second switching element 19 turns on.

Hereinafter, operations of the inductive load driving device 1 are explained with reference to FIG. 2. FIG. 2 is a timing chart illustrating the time relationship between the on/off states of the IG-SW (ignition switch) and the first to fourth switching elements 18, 19, 20a, and 24a, and a current flowing through the inductive load 4 (i.e., load current).

Although not shown in FIG. 1, the IG-SW is a switch configured to turn on and off supply of a power voltage to the control device that outputs PWM signals S1 to S3 to the inductive load driving device 1. In other words, only while the IG-SW is in on-state, the control device outputs the PWM signals S1 to S3 to the inductive load driving device 1. The reference voltage output circuit is configured to output the reference voltage Vref, which is a predetermined voltage, to the inductive load driving device 1 regardless of the on/off state of the IG-SW.

As shown in FIG. 2, when the IG-SW turns on at a time t1, the control device initiates outputting PWM signals S1 to S3 to the inductive load driving device 1. During a period of time t1 to t2, it is assumed that the second switching element 19 maintains on-state and that the first and third switching elements 18 and 20a are on/off-controlled with a predetermined duty cycle. It is noted that the on/off state of the third switching element 20a is inverse to that of the first switching element 18.

When the first switching element 18 is in on-state and the third switching element 20a is in off-state during the period of time t1 to t2, the one end of the inductive load 4 is electrically coupled to the output terminal 32 of the booster circuit 3, and the other end of the inductive load 4 is electrically coupled to the ground terminal. At this time, the output voltage Vout (=VB) of the booster circuit 3 is applied to the inductive load 4. For this reason, the load current increases as indicated by an increasing slope at a predetermine angle.

On the other hand, when the first switching element 18 is in off-state and the third switching element 20a is in on-state during the period of time t1 to t2, the one end of the inductive load 4 is electrically disconnected from the output terminal 32 of the booster circuit 3, and is electrically coupled to the ground terminal (while the other end of the inductive load 4 is still electrically coupled to the ground terminal). At this time, the output voltage Vout of the booster circuit 3 is not applied to the inductive load 4, a counter voltage is generated by the inductive load 4, and thus a counter current is output from the other end of the inductive load 4.

The counter current flows to the ground terminal through the second switching element 19, and thereby flows back to the one end of the inductive load 4 through the third switching element 20a. Thus, even when the first switching element 18 turns off, the load current of the inductive load 4 is kept at a given level (actually, the load current decreases a bit, but the decreased amount thereof is negligible).

Thus, the first and third switching elements 18 and 20a are PWM-controlled during the period of time t1 to t2 while the second switching element 19 maintains on-state, and thereby the rise characteristics of the load current can be controlled. Since a value of the output voltage Vout of the booster circuit 3 does not become equal to or more than the threshold value during the period of time t1 to t2, the fourth switching element 24a maintains off-state.

During a period of time t2 to t3, it is assumed that the second switching element 19 is on/off-controlled with a predetermined duty cycle while the first switching element 18 maintains off-state. During this period of time, the third switching element 20a maintains on-state.

When the second switching element 19 is in off-state during the period of time t2 to t3 (while the first switching element 18 maintains off-state and the third switching element 20a maintains on-state), the one end of the inductive load 4 is electrically disconnected from the output terminal 32 of the booster circuit 3 (and is electrically coupled to the ground terminal), and the other end of the inductive load 4 is electrically disconnected from the ground terminal. At this time, the output voltage Vout of the booster circuit 3 is not applied to the inductive load 4, a counter voltage is generated by the inductive load 4.

When the counter voltage becomes larger than the output voltage Vout of the booster circuit 3, a counter current flows from the other end of the inductive load 4 to the output terminal 32 of the booster circuit 3 through the first diode 21a. Thus, the counter current is stored as electric charge in the booster capacitor 38. For this reason, the counter current of the inductive load 4 decreases as indicated by a decreasing slope at a predetermined angel. At this time, a voltage, which is obtained by subtracting the amount of voltage drop caused by the first diode 21a from the counter voltage generated by the inductive load 4, is applied to the booster capacitor 38. However, it is assumed at this time that a value of the voltage applied to the booster capacitor 38 (i.e., the output voltage Vout of the booster circuit 3) does not become equal to or more than the threshold value.

On the other hand, when the second switching element 19 is in on-state during the period of time t2 to t3, the other end of the inductive load 4 is electrically coupled to the ground terminal (while the one end of the inductive load 4 is still electrically coupled to the ground terminal). At this time, the output voltage Vout of the booster circuit 3 is not applied to the inductive load 4, a counter voltage is generated by the inductive load 4. Thus, a counter current flows from the other end of the inductive load 4 to the ground terminal through the second switching element 19. Further, the counter current flows back to the one end of the inductive load 4 through the third switching element 20a. Accordingly, the load current of the inductive load 4 maintains at a given level (actually decreases a bit, but the decreased amount thereof is negligible).

Thus, the second switching element 19 is PWM-controlled during the period of time t2 to t3 while the first switching element 18 maintains off-state and the third switching element 20a maintains on-state, and thereby the fall characteristics of the load current can be controlled. Since a value of the output voltage Vout of the booster circuit 3 does not becomes equal to or more than the threshold value during the period of time t2 to t3, the fourth switching element 24*a* maintains off-state.

The operations during a period of time t3 to t4 is the same as those during the period of time t1 to t2, and therefore explanations thereof are omitted here. When the IG-SW turns off at a time t4, the control device terminates outputting the PWM signals S1 to S3 to the inductive load driving device 1. Accordingly, after the time t4, the first to third switching elements 18, 19, and 20*a* become in off-state (while the fourth switching element 24*a* maintains off-state from the beginning).

As explained above, when both the first and second switching elements 18 and 19 become in off-state, a counter voltage is generated by the inductive load 4, and a counter current flows from the other end of the inductive load 4 to the output terminal of the booster circuit 3. In other words, a voltage, which is obtained by subtracting the amount of voltage drop caused by the first diode 21*a* from the counter voltage generated by the inductive load 4, is applied to the booster capacitor 38. However, it is assumed that a value of the voltage applied to the booster capacitor 38 (i.e., the output voltage Vout of the booster circuit 3) becomes equal to or more than the threshold value at a time t5.

Thus, when a value of the output voltage Vout of the booster circuit 3 becomes equal to or more than the threshold value at the time t5, the fourth switching element 24*a* turns on. Additionally, the output terminal 32 of the booster circuit 3 is electrically coupled to the gate terminal of the second switching element 19, and the second switching element 19 turns on. As a result, the other end of the inductive load 4 is electrically coupled to the ground terminal. Accordingly, the counter current output from the inductive load 4 flows into the ground terminal.

Thus, when a value of the output voltage Vout of the booster circuit 3 (i.e., the voltage applied to the booster capacitor 38) becomes equal to or more than the threshold value, the second switching element 19 turns on, and thereby the counter current flows into the ground terminal. Thereby, an increase in the output voltage Vout of the booster circuit 3 (i.e., an increase in the voltage applied to the booster capacitor 38) can be prevented.

In other words, according to the inductive load driving device 1 of the first embodiment, the booster capacitor 38 of the booster circuit 3 can be prevented from being broken down.

It is apparent that the present invention is not limited to the above embodiments, and may be modified and changed without departing from the scope and spirit of the invention.

For example, it has been explained in the first embodiment that the booster circuit 3 exemplifies a power circuit supplying a power voltage to the inductive load driving device 1. As long as a power circuit includes a capacitor coupled between an output terminal of the power circuit and a ground terminal, circuit elements included in the power circuit can be protected by employing the inductive load driving device of the present invention.

Additionally, it has been explained in the first embodiment that the looping circuit 20 includes the third switching element 20*a*. However, a configuration of the looping circuit 20 is not limited thereto as long as a counter current, which is output from the other end of the inductive load 4 when the first switching element 18 is in off-state and the second switching element 19 is in on-state, can flow back to the one end of the inductive load 4. For example, the looping circuit as disclosed in Japanese Patent Laid-Open Publication No. 2008-85046 may be used.

Further, it has been explained in the first embodiment that the counter current regeneration circuit 21 includes the first diode 21*a*. However, the configuration of the counter current regeneration circuit 21 is not limited thereto as long as the counter current, which is output from the other end of the inductive load 4 when the first and second switching elements 18 and 19 are in off-state, can flow to the output terminal 32 of the booster circuit 3. For example, the counter current regeneration circuit as disclosed in Japanese Patent Laid-Open Publication No. 2008-85046 may be used.

Moreover, regarding the circuit configuration of the circuit element protection circuit 22, any circuit configuration may be used as long as the second switching element 19 turns on when a value of the output voltage Vout of the booster circuit 3 becomes equal to or more than the threshold value.

The term "configured" is used to describe a component, section or part of a device includes hardware and/or software that is constructed and/or programmed to carry out the desired function.

The terms of degree such as "substantially," "about," and "approximately" as used herein mean a reasonable amount of deviation of the modified term such that the end result is not significantly changed. For example, these terms can be construed as including a deviation of at least ±5 percent of the modified term if this deviation would not negate the meaning of the word it modifies.

What is claimed is:

1. An inductive load driving device comprising:
    a first switching element coupled between an output terminal of a power circuit and one end of an inductive load;
    a second switching element coupled between another end of the inductive load and a ground terminal;
    a counter current regeneration circuit configured to supply to the output terminal of the power circuit, a counter current output from the another end of the inductive load when the first and second switching elements are in off-state; and
    a circuit element protection circuit configured to electrically couple the output terminal of the power circuit to a control terminal of the second switching element and turn on the second switching element when a value of the output voltage of the power circuit becomes equal to or more than a threshold value;
    wherein the circuit element protection circuit comprises:
    a determination circuit configured to determine whether or not the value of the output voltage of the power circuit becomes equal to or more than the threshold value by comparing a value of a divided voltage of the output voltage of the power circuit and a value of a divided voltage of a reference voltage; and
    a conduction circuit configured to electrically couple the output terminal of the power circuit to the control terminal of the second switching element when the determination circuit determines that the value of the output voltage of the power circuit becomes equal to or more than the threshold value.

2. The inductive load driving device according to claim 1, wherein
    the counter current regeneration circuit comprises a diode having an anode terminal and a cathode terminal,
    the anode terminal is coupled to the another end of the inductive load, and
    the cathode terminal is coupled to the output terminal of the power circuit.

3. The inductive load driving device according to claim 1, further comprising:

a looping circuit configured to supply to the one end of the inductive load through the ground terminal, a counter current output from the other end of the inductive load when the first switching element is in off-state and the second switching element is in on-state.

4. The inductive load driving device according to claim 3, wherein the looping circuit comprises a third switching element coupled between the one end of the inductive load and the ground terminal, the third switching element is configured to be in on-state while the first switching element is in off-state, and the third switching element is configured to be in off-state while the second switching element is in on-state.

* * * * *